United States Patent
Wong

(10) Patent No.: US 7,146,709 B2
(45) Date of Patent: Dec. 12, 2006

(54) PROCESS FOR PRODUCING SUPERCONDUCTOR

(75) Inventor: James Wong, Wayland, MA (US)

(73) Assignee: Composite Materials Technology, Inc., Shrewsbury, MA (US)

( * ) Notice: Subject to any disclaimer, the term of this patent is extended or adjusted under 35 U.S.C. 154(b) by 171 days.

(21) Appl. No.: 10/736,650

(22) Filed: Dec. 16, 2003

(65) Prior Publication Data

US 2004/0244185 A1    Dec. 9, 2004

Related U.S. Application Data

(63) Continuation-in-part of application No. 10/282,354, filed on Oct. 29, 2002, now Pat. No. 6,836,955, which is a continuation-in-part of application No. 10/037,935, filed on Jan. 2, 2002, now Pat. No. 6,918,172, which is a continuation-in-part of application No. 09/753,200, filed on Jan. 2, 2001, now abandoned, which is a continuation-in-part of application No. 09/532,362, filed on Mar. 21, 2000, now Pat. No. 6,543,123.

(60) Provisional application No. 60/434,039, filed on Dec. 17, 2002.

(51) Int. Cl.
*H01L 39/24* (2006.01)

(52) U.S. Cl. .............................. 29/599; 29/412; 148/98; 174/125.1; 505/231; 505/431

(58) Field of Classification Search .................. 29/412, 29/417, 599, 825; 174/15.5, 125.1; 361/528; 428/662; 505/430–432, 230–323; 148/98; 419/3

See application file for complete search history.

(56) References Cited

U.S. PATENT DOCUMENTS

| | | | |
|---|---|---|---|
| 3,218,693 A | 11/1965 | Allen et al. | 29/155.5 |
| 3,277,465 A | 10/1966 | Webber et al. | 29/419 |
| 3,277,564 A | 10/1966 | Webber et al. | 29/419 |
| 3,379,000 A | 4/1968 | Webber et al. | 57/139 |
| 3,394,213 A | 7/1968 | Roberts et al. | 264/174 |
| 3,429,032 A | 2/1969 | Martin et al. | 29/599 |
| 3,567,407 A | 3/1971 | Yoblin | 29/191.4 |
| 3,698,863 A | 10/1972 | Roberts et al. | 29/183.5 |

(Continued)

FOREIGN PATENT DOCUMENTS

JP        2106885 A2    4/1990

(Continued)

OTHER PUBLICATIONS

Xu, J-Q, et al, Development of Internal-Tin Diffusion Multifilamentary Nb3Sn Conductra including Hydrostatic extrusion, IEEE Transaction of Magnetics, Mar. 1988, vol. 24, No. 2, pp. 1127-1130.*

(Continued)

*Primary Examiner*—Minh Trinh
*Assistant Examiner*—Donghai D. Nguyen
(74) *Attorney, Agent, or Firm*—Hayes Soloway P.C.

(57) ABSTRACT

A superconducting material useful for forming electrolytic devices is made by establishing multiple niobium or tantalum components in a primary billet of a ductile material; working the primary billet through a series of reduction steps to form the niobium or tantalum components into elongated elements; cutting and restacking the resulting elongated elements with a porous confining layer to form a secondary billet, working the secondary billet through a series of reduction steps including twisting and final rolling to thin ribbon cross-sections with greater than 5:1 Aspect Ratios; cutting the resulting elongated billet into sections; and leaching the core and sheath at least in part.

10 Claims, 5 Drawing Sheets

U.S. PATENT DOCUMENTS

| | | | | |
|---|---|---|---|---|
| 3,742,369 | A | | 6/1973 | Douglass .................... 317/230 |
| 3,743,986 | A | * | 7/1973 | McInturff et al. ........... 335/216 |
| 3,800,061 | A | | 3/1974 | Larson et al. ................. 174/15 |
| 4,055,887 | A | * | 11/1977 | Meyer ......................... 29/599 |
| 4,224,087 | A | * | 9/1980 | Tachikawa et al. ........... 148/98 |
| 4,502,884 | A | | 3/1985 | Fife ....................... 75/0.5 AB |
| 4,611,390 | A | * | 9/1986 | Tanaka et al. ................ 29/599 |
| 4,746,581 | A | * | 5/1988 | Flukiger ..................... 428/614 |
| 4,767,470 | A | * | 8/1988 | Tachikawa et al. ........... 148/98 |
| 4,776,899 | A | * | 10/1988 | Murase et al. ................ 148/98 |
| 4,977,039 | A | * | 12/1990 | Onishi et al. ............... 428/623 |
| 5,034,857 | A | | 7/1991 | Wong ......................... 362/509 |
| 5,174,831 | A | | 12/1992 | Wong et al. .................. 148/98 |
| 5,223,348 | A | | 6/1993 | Wong et al. ................ 428/635 |
| 5,245,514 | A | | 9/1993 | Fife et al. .................... 361/529 |
| 5,299,728 | A | * | 4/1994 | King et al. .............. 228/179.1 |
| 5,306,462 | A | | 4/1994 | Fife ............................ 419/24 |
| 5,505,790 | A | * | 4/1996 | Benz et al. ................... 148/98 |
| 5,534,219 | A | | 7/1996 | Marancik et al. .............. 419/4 |
| 5,540,787 | A | * | 7/1996 | Johnson et al. .......... 360/97.01 |
| 5,541,787 | A | | 7/1996 | Jabbari et al. ........... 360/97.01 |
| 5,554,448 | A | * | 9/1996 | Yamada et al. ............. 428/662 |
| 5,869,169 | A | * | 2/1999 | Jones ......................... 428/213 |
| 5,869,196 | A | | 2/1999 | Wong et al. ................ 428/613 |

FOREIGN PATENT DOCUMENTS

| | | | |
|---|---|---|---|
| JP | 2197017 | A | 8/1990 |
| JP | 03-208279 | * | 9/1991 |
| JP | 3-208279 | | 9/1991 |
| JP | 3208279 | | 9/1991 |
| JP | 3208279 | A | 9/1991 |
| JP | 4033272 | A | 2/1992 |
| JP | 11-250747 | | 9/1999 |
| WO | WO 00/63456 | | 10/2000 |
| WO | WO 02/45106 | | 6/2002 |

OTHER PUBLICATIONS

Sakamoto et al, Very High Critical Current Density of Bronze-Processed (Nb, Ti)Sn Superconductng Wire IEEE Transactions on Applied Superconductivity, vol. 10, No. 1, Mar. 2000, pp. 971-974.*

Rumaner et al. Effect of Oxygen and Zirconium on the Growth and Superconting Properties of Nb3Sn, Metallurgical and Materials Transactions, vol. 25A, Jan. 1994, pp. 203-211.*

Naus et al The Interdiffusion of Cu and Sn in Internal Sn Nb3Sn Superconductors, IEEE Transactions ASC, vol. 10, No. 1, pp. 983-987.*

Caslaw , J.S. "The Influence of Liquid Metal Infiltration on Superconducting Charactristics of Niobium Nitride", Advances in Cryogenic Eng., vol. 34, pp. 835-847, 1987.*

Tachikawa, K., Developments of A15 Elementary Composite Superconductors in Japan by Masaki Suenaga and Alan F. Clark, Plenum Press, NY, Cryogenic Mat. Series 1980, pp. 1-15.*

Katagiri et al. "Tensile Strain/Transverse Compressive Stress Effects in Nb3Sn Multfilimentary Wires with CuNb Reinforcing Stabilizer" Adbvances in Cryogenic Eng. , vol. 42, Plenum Press, NY, pp. 1423-1432.*

Dew-Hughes et al "Treatise on Material Science and technology", vol. 14, Metallurgy of Superconducting Materials, 1979, pp. 429-432.*

Valder, B. "Niobium Alloy C-103/Aerospace Applications" Wah Chang, Outlook 1st Quarter 2000.*

"Alternative Materials for Electrolytic Capacitor" Reichert et al., T.I.C. Bulletin, No. 109, Mar. 2002.

"Development of Internal-Tin Diffusion Multifilamentary Nb3Sn Conductors Including Hydrostatic Extrusion" Xu et al., IEEE Transactions on Magnetics, vol. 24, No. 2, Mar. 1998, p. 1127-1130.

Smathers et al., "A15 Superconductors", Metals Handbook, Tenth Edition, vol. 2, pp. 1060-1077.

Rosner et al., "Review of Superconducting Activities at IGC on A-15 Conductors", Filamentary A-15 Superconductors, Plenum Press, NY published 1980, pp. 67-79.

Rumaner et al., "Effect of Oxygen and Zirconium on the Growth and Superconductin Properties of Nb3Sn" Metallurgical and Materials Transactions, vol. 25A, Jan. 1994, pp. 203-211.

Naus et al. "The Interdiffusion of Cu and Sn in International Sn Nb3Sn Superconductors", IEEE Transaction ASC, vol. 10, No. 1, pp. 983-987.

Caslaw, J.S., "Enhancement of the Critical Current Density in Niobium-Tin" Cryogenics, Feb. 1971, pp. 57-59.

Summers et al., "The Influence of Liquid Metal Infiltration on Superconducting Characteristics on Niobium Nitride", Advanced in Cryogenic Eng., vol. 34, pp. 835-842, 1987.

Sakamoto et al., "Very High Critical Current Density of Bronze-Processed (Nb,Ti)3Sn Superconducting Wire" IEEE Transactions on Applied Superconductivity, vol. 10, No. 1, Mar. 2000, pp. 971-974.

Tachikawa, K., "Developments of A15 Filamentary Composite Superconductors in Japan" by Masaki Suenaga and Alan F. Clark, Plenum Press, NY, Cryogenic Mat. Series 1980, pp. 1-15.

Caslaw, J.S. "The Influence of Liquid Metal Infiltration on Superconducting Charactristics of Niobium Nitride", Advances in Cryogenic Eng., vol. 34, 1987, pp. 835-847.

Scanlan et al., "Multifilamentary NB3Sn for Superconducting Generator Applications", IEEE Trans. MAG-11, Mar. 1975, pp. 287-290.

Katagiri et al., "Tensile Strain/Transverese Compressive Stress Effects in Nb3Sn Multifilamentary Wires with CuNb Reinforcing Stabilizer" Advances in Cryogenic Eng., vol. 42, Plenum Press, NY, pp. 1423-1432.

Dew-Hughes et al. "Treatise on Material Science and Technology" vol. 14, Metallurgy of Superconducting Materials,1979, pp. 429-432.

Valder, B., "Niobium Alloy C-103/Aerospace Applications" Wah Chang, Outlook 1st Quarter 2000.

"Anisotropy of Optimized and Not Optimized Technical NbTi Superconductors" Best et al., IEEE Transactions on Magnetics, vol. Mag-15, No. 1, Jan. 1979, pp. 765-767.

"Anisotropy of the Critacal Current in Solid Solution Superconductor NbTi" Best et al., IEEE Transations on Magnetics, vol. Mag-15, No. 1, Jan. 1979, pp. 395-397.

Xu et al, "Development of Internal-Tin Diffusion Mulitfilamentary Nb3Sn Conductors including Hydrostatic Extrusion", IEEE Transactions on Magnetics, vol. 24, No. 2, Mar. 1988. pp. 1127-1130.

* cited by examiner

PROCESS FOR PRODUCING SUPERCONDUCTOR

This application claims priority from U.S. Provisional Application Ser. No. 60/434,039, filed Dec. 17, 2002, and is a continuation-in-part of application Ser. No. 10/282,354, filed Oct. 29, 2002, now U.S. Pat. No. 6,836,955, which is in turn a continuation-in-part of application Ser. No. 10/037,935, filed Jan. 2, 2002, now U.S. Pat. No. 6,918,172, which is in turn a continuation-in-part of Ser. No. 09/753,200, filed Jan. 2, 2001, now abandoned, which is in turn a continuation-in-part of U.S. application Ser. No. 09/532,362, filed Mar. 21, 2000, now U.S. Pat. No. 6,543,123 issued Apr. 8, 2003. The subject matter of all of these parent applications is incorporated herein by reference.

BACKGROUND OF THE INVENTION

The present invention is directed to the production of electrical devices, e.g. electrolytic capacitors and superconducting materials based on the use of valve metals such as tantalum and niobium and its alloys. In work done previously by the assignee of this patent application there have been described developments wherein filaments of refractory metals such as tantalum and niobium are extruded in a softer metal such a copper while encased in a surrounding sleeve of the valve metal e.g. tantalum or niobium. Utilizing this technology filaments of either tantalum or niobium have been drawn to very small diameters while in the copper matrix and while surrounded by the constraining layer of tantalum or niobium. The copper is leached out from between the very fine filaments in the final product while the fine filaments are constrained in a manageable bundle by the outer constraining acid resistant layer of tantalum or niobium. This technology is more fully described in our prior parent U.S. Pat. No. 5,869,196 and our PCT Application Serial No. PCT/US03/24724, filed Aug. 7, 2003.

In the present invention there is an improvement over the processed described in the '196 patent above wherein the constrained mass of small fine tantalum or niobium filaments is subjected to a rolling deformation which flattens the individual small filaments so that each wire has aspect ratio of at least 5:1. This relatively high aspect ratio in the final compressed and flattened individual fine filaments has the following major advantages. When the Nb is reacted to form $Nb_3Sn$, currently, round Nb filaments require in excess of 180 hours at 700° C. to completely react 4-micron filaments. The same filament rolled to an aspect ratio of 5:1 will be only 1.26μ thick by 12.6μ wide and can be fully reacted using considerably shorter times. By reducing the time and distance for reaction, finer grain size and more importantly, uniform $Nb_3Sn$ are obtained and as a result, higher current densities as well.

A flat conductor is easier to wind into a magnet and it has higher filling factor where the void space when a round conductor is used is eliminated. Another important consideration is that thin conductors are more ductile and can be wound into magnets of small diameters. A reacted $Nb_3Sn$; flattened to an aspect ratio of 5:1, with a thickness of 0.02 mm thickness by 0.02 mm wide can be bent around a radius of 5 cm without fracturing the wire. This offers the possibility of reaction and winding, similar to present day ductile NbTi magnets.

An unexpected discovery has been that the improvements for superconductor have been shown to be even more important for capacitors. The filament size, its number, spacing and surface area/unit volume are exactly the same critical designs parameters for both applications. In the case for superconductors, the entire Nb filament is converted to superconducting $Nb_3Sn$. For capacitors, the surface of the Nb filament is converted to $Nb_2O_5$, the dielectric compound for capacitors use. In fact, with only minor size and shape adjustment, the wire can be used as either a superconductor or as an anode for solid Nb electrolytic capacitors. Confirmation of the dual use possibility of this invention are further demonstrated by two recent publications, *Alternative Materials for Electrolytic Capacitors* by Dr. K. Reichert, T. I. C. Bulletin, No. 109 March 2002 page 2–3, and *Powder for Capacitor, Sintered Body Thereof and Capacitor Using the Sinter Body* PCT/JP01/10484 OMORI, Kazuhiro, 6 Jun. 2002, where Ta and Zr alloys of Nb, used for superconductors, has been shown to have excellent capacitor properties as well.

BRIEF DESCRIPTION OF THE DRAWINGS

FIG. 1 is a schematic depiction of the primary billet used in the preferred embodiment of the present invention.

FIG. 3 is a schematic depiction of the transverse cross section of the secondary billet used in the process of the present invention.

FIG. 4 is a schematic depiction of the product of the preferred embodiment of the present invention.

FIG. 5 schematically illustrates another embodiment of the present invention.

DETAILED DESCRIPTION OF THE INVENTION

Figure 1A:
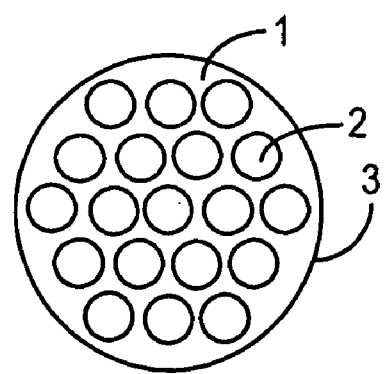
FIG. 1a shows a transverse cross section.
Figure 1B:
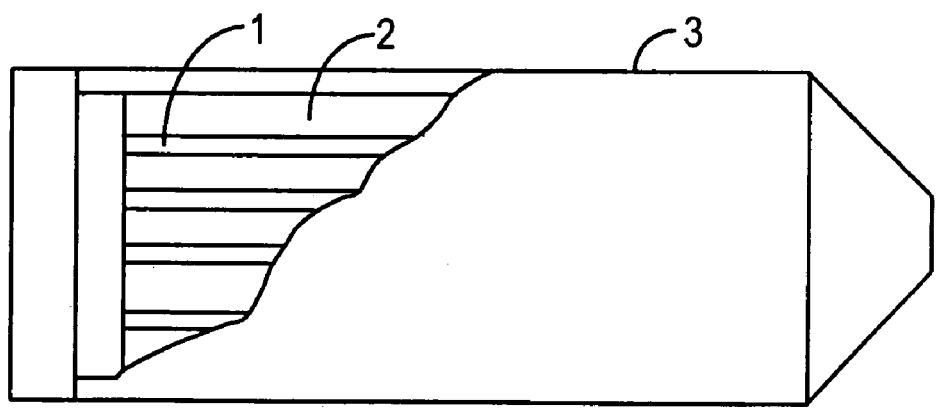
FIG. 1b is a cutaway view revealing the longitudinal disposition of the billet components.

In the preferred embodiment of the present invention for making capacitor anodes, the process begins with niobium or tantalum rods that are inserted into holes drilled longitudinally into a copper billet, shown schematically in FIGS. 1a and 1b. Referring to the Figures, the copper forms a matrix 1 which separates the tantalum or niobium rods 2. The assembly as a whole forms the primary billet 3. As FIG. 1b indicates, the rods run longitudinally through the body of the billet and are substantially parallel. After assembly, a copper nose and tail are welded onto the primary billet, and the billet is then evacuated and sealed. At this point the primary billet may optionally be hot or cold isostatically pressed (HIP'd or CIP'd) in order to collapse any void space, thereby promoting filament uniformity. If the billet is hot or cold isostatically pressed, it will usually be machined on a lathe afterwards in order to restore a cylindrical shape.

Figure 2:
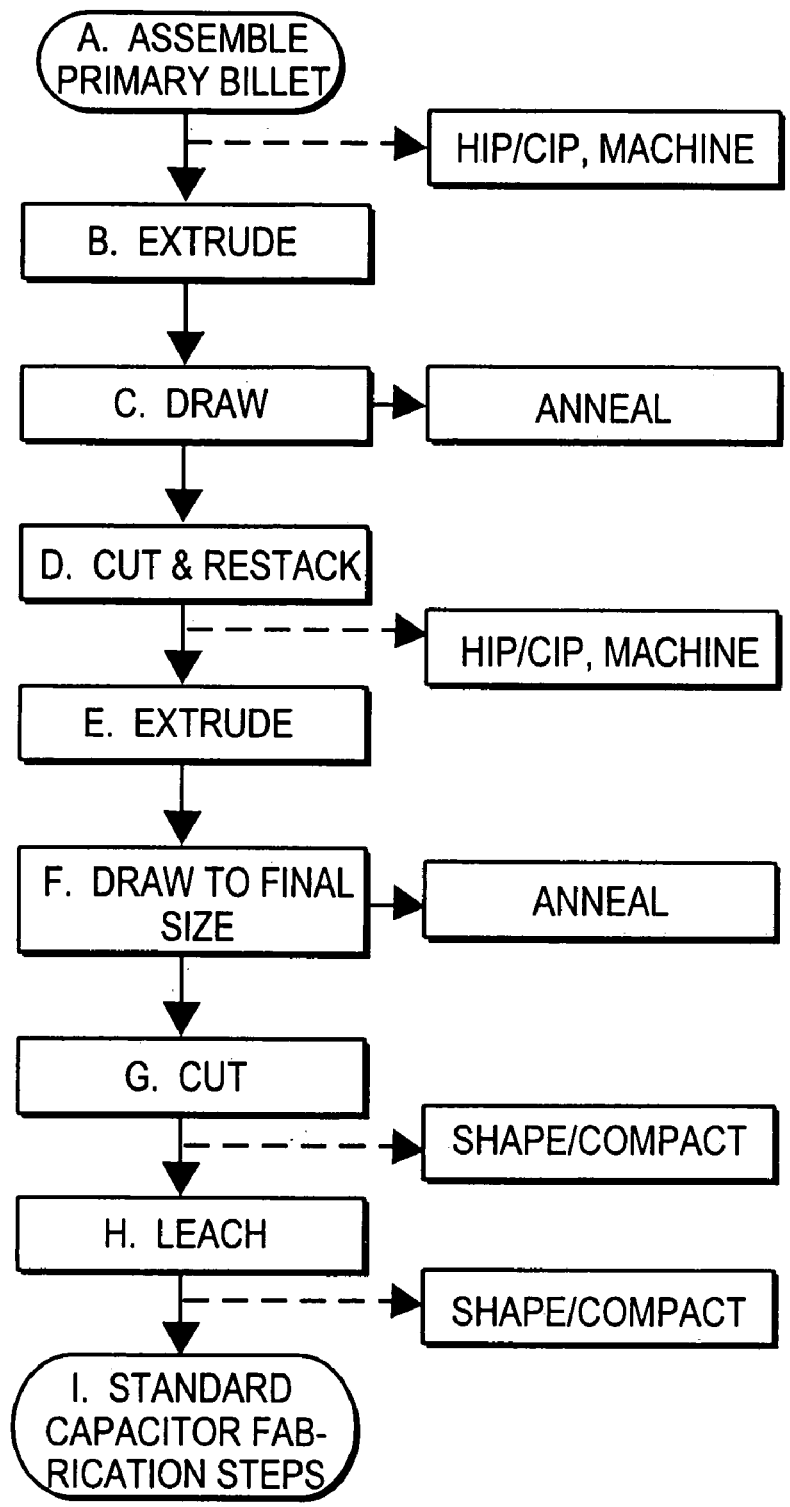
FIG. 2 is a flow-chart describing the steps followed in the execution of the process used in the preferred embodiment of the invention, along with steps that may be employed in other embodiments.

The primary billet, containing the niobium or tantalum rods in a copper matrix, is processed in accordance with the flow-chart of FIG. 2. The billet is extruded at elevated temperature at a diameter reduction ratio of approximately 6:1. The resulting rod is cropped, and the rod is drawn down to restack diameter. As indicated in FIG. 2, annealing may optionally be performed during drawing should the wire become too stiff or breakage occurs. Annealing temperatures for tantalum and niobium are well known in the art they are typically in the range of 900° C.

At restack diameter, the composite wire is cut into lengths for assembly into the secondary billet. The secondary billet transverse cross section is shown schematically in FIG. 3a. The subelements 4 made from the primary billet are stacked together with copper rods. The copper rods are used to form a copper core 5, and an outer annulus 6. Both the core and the outer annulus are provided in order to make leaching of the final composite less difficult. Outside the assembly of the subelements and copper rods is a layer of tantalum sheet 7. The sheet is the same length as are the rods and it completely surrounds the filament array. The sheet thickness is comparable to the diameter of the niobium or tantalum filaments within the subelements. Outside the cylinder of niobium or tantalum sheet is an outer copper can 8.

The secondary billet is assembled, a nose and tail are welded into place, and the billet is evacuated and sealed. The sealed billet is optionally prepared for extrusion by hot or cold isostatic pressing in order to collapse any void space within the billet and to promote filament uniformity. After isostatic pressing, the secondary billet is machined to fit the extrusion liner. The billet is then extruded at elevated temperature at a diameter reduction ratio of 6:1.

The extruded rod is cropped, and the rod is then drawn to a diameter where the niobium or tantalum filament diameter is 5 microns or less. Again, as indicated in FIG. 2, annealing steps may be employed if necessary. At final size, the composite wires is cut into short lengths as required, preferably not less than 1.5 times the final wire diameter. The cutting process must be as "clean" as possible, by which is meant that smearing or pinching at the ends of the cut sections must be kept to a minimum. If the cutting does not provide sufficiently clean ends, this will interfere with the subsequent leaching process. Clean cut ends may be achieved through the use of a high-precision impact cutoff machine.

The cut sections are immersed in a solution of nitric acid and water. A suitable solution would be one part nitric acid to one part water, but other concentrations of nitric acid can be employed if required. The sections are immersed for a period of time sufficient for the acid to fully leach out the filaments and the sheath. The total time will depend primarily upon the composite wire diameter and length, with smaller diameters and greater lengths requiring longer times. This is due to the fact that the acid can only penetrate through the ends of the cut sections. Narrow openings and long distances do not lend themselves to rapid etching.

Figure 3A:
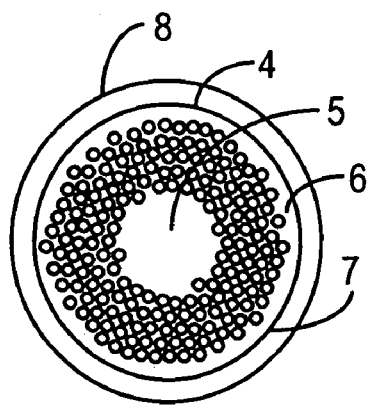
FIG. 3a shows the billet in the preferred embodiment of the present invention, wherein the sheath is circumferentially continuous.

In regard to the leaching process, it is an essential feature of this embodiment of the present invention that the secondary billet is provided with a copper core 5 and a copper annulus 6 (FIG. 3a). During the leaching process, the copper core and annulus etch away much more rapidly than does the copper separating the filaments, since the filaments are comparatively tightly spaced. As a result, the acid eventually surrounds the annulus of filaments, and can then attach the filament matrix from all directions, rather than just from the ends of the cut sections. The design of the secondary billet thus greatly improves the efficiency of the leaching process.

Figure 4A:
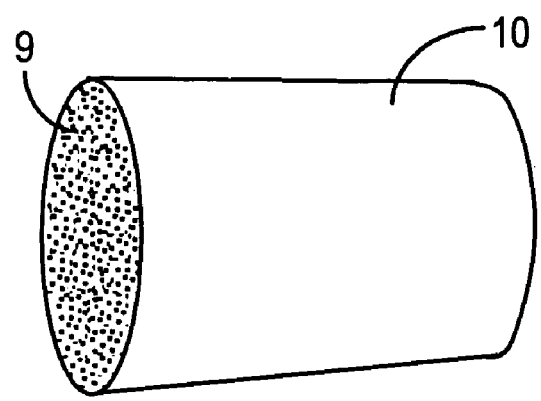
FIG. 4a shows the product as a cylindrical body.
Figure 4B:
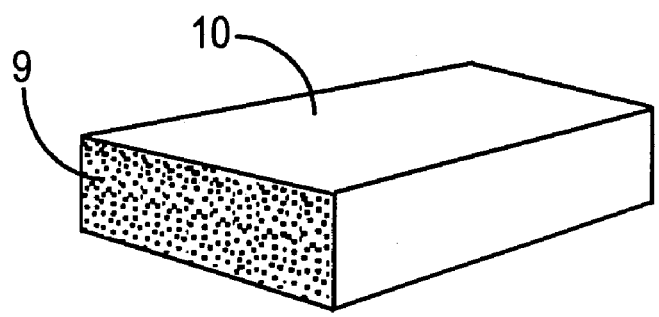
FIG. 4b shows the product after shaping into a rectangular body.

After leaching, one is left with the product of the present invention, shown schematically in FIG. 4a. It consists of fine filaments (<5 micron diameter) 9, surrounded by a thin tube 10. This product can be made into an anode for an electrolytic capacitor by conventional means, including sintering, anodizing, infiltrating with electrolyte, etc. It may be desirable to shape the product of the present invention by means such as pressing in a die. A rectangular chip can be produced in this manner. Such a chip is illustrated in FIG. 4b. A rectangular chip may be more compatible with current industry standards. The shaping is preferably performed prior to sintering of the product. The shaping may be done either with or without the ductile metal matrix present (see FIG. 2). In addition to shaping, it may be desirable to further compact the product of the present invention. In such cases, the product is compressed, rather than simply reshaped. Further compaction may be beneficial to electrical continuity with the compact.

Depending upon the degree of electrical continuity and the level of purity within the product of the present invention, it may not be necessary to sinter the product. If sintering is avoided, the process of the present invention will be less expensive. The decision on whether or not to sinter the product will depend primarily upon the requirements of the application.

Figure 3B:
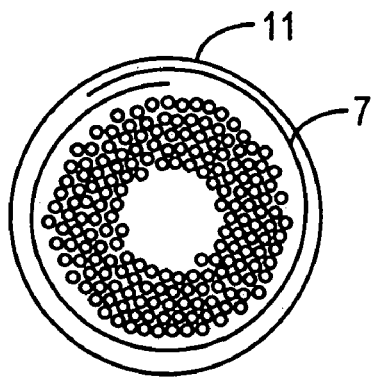
FIG. 3b shows the billet in another embodiment, wherein the sheath contains a gap that renders it circumferentially discontinuous, but overlapping.

Another embodiment of the invention employs the secondary billet illustrated schematically in FIG. 3b. The billet is identical to that shown in FIG. 3a except that the layer of niobium or tantalum sheet 7 is not circumferentially continuous, but contains a gap 11. The gap is positioned at an overlap in the sheet, so that the filaments are completely surrounded by the niobium or tantalum layer, much as in the preferred embodiment. A section of copper sheet is inserted into the gap so as to prevent niobium or tantalum-to-niobium or tantalum contact in the region of the overlap. Processing of the secondary billet proceeds exactly as described above, including leaching in nitric acid. The gap in the sheath accelerates the leaching process, since the acid can now penetrate from the exterior of the cut sections, as well as from the ends.

Figure 3C:
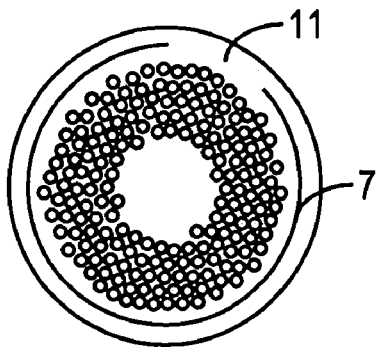
FIG. 3c is similar to FIG. 3b in that the sheath is shown as being circumferentially discontinuous, but no overlap is present.

Yet another embodiment of the invention employs the secondary billet illustrated schematically in FIG. 3c. This embodiment is similar to that illustrated in FIG. 3b, and described above, except that the sheet 7 does not overlap. The sheet does not fully surround the filaments, leaving the gap 11. Although the sheet does not fully surround the filaments, it does to a substantial extent, so that the filaments are for the most part constrained. Processing of the secondary billet proceeds as described above. Again, the gap in the sheath serves to accelerate the leaching process.

Figure 5A:
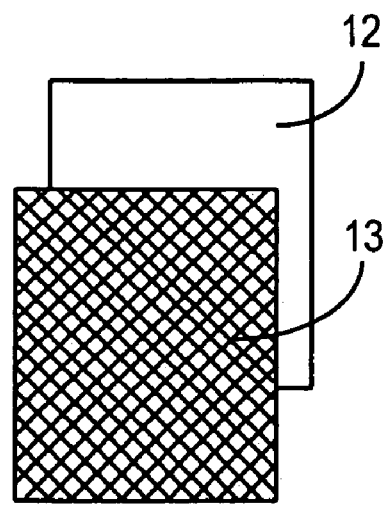
FIG. 5a shows the transverse cross section of the secondary billet used in this embodiment of the present invention.
Figure 5B:
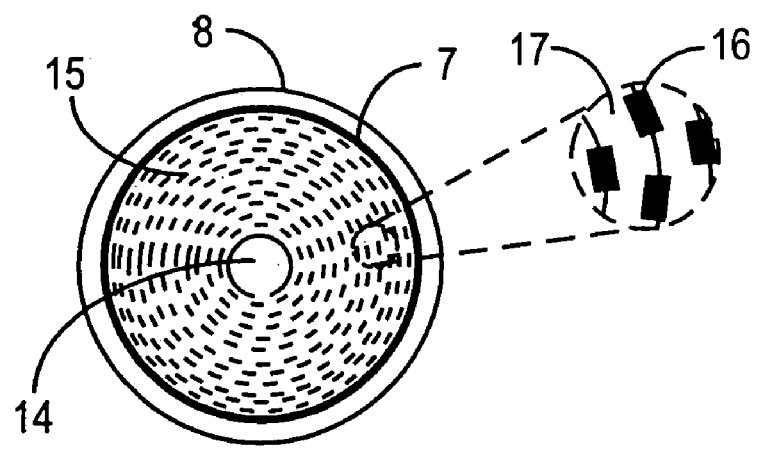
FIG. 5b shows the product of this embodiment as a cylindrical body with a thin, metallurgically bonded tab of tantalum or niobium.

Yet another embodiment of the present invention employs the secondary billet illustrated schematically in FIG. 5a. The secondary billet is similar to that illustrated in FIG. 3b, except that the copper sheet is circumferentially continuous. Referring to FIG. 5a, the cooper sheet 7 fully encloses the array of filaments in their copper matrix, and then continues for some distance to create the overlap 18. The overlap is separated from the bulk of the sheath by a section of copper sheet that is inserted into the gap 11. The secondary billet is processed as in the preferred embodiment of the invention. After the final leaching step, one is left with a number of small bodies like that illustrated schematically in FIG. 5b. The filaments 9 are constrained within the sheath 10. The overlapping sheet 18 of the secondary billet forms a thin tab that is metallurgically bonded to the sheath as a result of secondary billet processing. A lead wire may be attached to the tantalum tab or the tab itself may be used as a lead wire during anodization and impregnation of the capacitor. The tab may also serve as an electrical contact in final capacitor packaging.

In other embodiments of the invention, all or part of the sheath is made to be perforated or porous so as to accelerate the leaching process while still maintaining the effectiveness of the sheath with regard to constraint of the enclosed filaments.

Patent '196, specifically describes the inclusion of a separate outer sheath of Tantalum or Niobium to further constrain the filament bundle. A major advantage of both processes is illustrated in FIGS. 4a and 4b of patent '196, where examples of finished shaped anodes are shown and thus eliminates completely the need to handle and press fine powders.

The ability to shape the anode to almost any shape or form provides the basis for capacitor application. The papers as listed below are relevant to this application.

1. D. A. McLean, *The AC Properties of Tantalum Solid Electrolytic Capacitors*, journal of the Electro chemical Society January 1961 page 48–56.
2. P. L. Bourgault and J. Batlaan, *Low ESR Solid Tantalum Capacitors*; Proceeding Electronic Component Conference 1968, page 38–43.
3. S. Hluchan, *Powder Geometry and Structural Design of the High Volumetric Efficiency Tantalum Electrolytic Capacitor*: IEEE Transaction on Parts, Hybrids, and Packaging, Volume PHP-9, No. 3, Sep. 1973, page 148–155.

McLean shows that the A.C. properties of porous tantalum solid electrolytic capacitors are frequency dependent and that the capacitance decreases and internal resistance or ESR increases with increasing frequency. Theoretically, an ideal capacitor would operate with essentially zero ESR. As the ESR increases, heat is generated, possibly leading to capacitor failure, and electrical circuit problems. In Bourgault's equation 9, the dissipation factor or ESR is proportioned to the square of the radius of the capacitor. In other words, the efficiency of the capacitor is size dependent. He concluded that a thin wall anode or hollow tube was the desired shape and as a result, U.S. Pat. No. 3,345,545 was issued. The concept of an ideal anode shape to improve capacitors performance was also confirmed in the paper by Hluchan. An ideal anode would be one where the thickness is that of a foil, somewhere about 25 to 100 microns and a width of approximately 2–10 mm wide. The foil should be porous, and contain a high specific surface area/volume. Most importantly it must be robust and capable of being physically handled when subjected to the processing step necessary to produce a finished capacitors. It has been found in our experiments that the chip anode shape of FIG. 4b of my patent '196 can in fact produce the desired foil and is illustrated by Table 1. In table 1, 0.020" and 0.030" round wires, made according to our patent '857 and '196, were rolled to the indicated thin ribbon dimensions. Billet 33B/30A contains 9/125 filaments and measures 12µ and 18µ in diameter at the 0.020" and 0.030" sizes prior to rolling. As the rolling reduction is increased, the width also substantially increases. Aspect ratio of greater than 40:1 has been obtained. The optimum aspect ratio would generally favor the thinnest foil. Other factors can, however influence the degree of reduction. For example, as the filaments are flattened, they are also closer together and copper removal can become difficult. If the filaments are too thin, then, they can possibly lose capacitance, since they can be totally consumed during the anodization step.

TABLE 1

| Sample | Size & Shape | Size/Shape |
|---|---|---|
| 33B/30A | 0.020" round | 0.030" round |
| 33B/30A | 0.010 × 0.030" | |
| 33B/30A | 0.006 × 0.047" | 0.00285" × .125" |
| 33B/30A | 0.004 × 0.079 foil | |

Metallagraphic studies of the cross-section show that the decreasing thickness, the filament are also flatten and its aspect ratio increases to as much as 10:1, measuring approximately 2µ×20µ wide. It is obvious that the rolling process has increased the available surface area of the filaments significantly and at the same time provide the ideal shape for AC application.

Handling of these highly aspected thin foils can be more difficult after leaching. Some structural support appears to be necessary. This can be accomplished by a simple change in billet design. In place of a uniform array of rods as shown in FIG. 1a, a single large diameter rod is inserted into the center of the billet. This billet, when finally rolled to the desired thickness and width will form a continuous inner foil exactly at the center of the larger foil, surrounded by the outer filaments. It now supports the filaments, provides a common electrical contact, and acts as a convenient location for the anode termination. The central rod should not exceed 20% by area of Cu and can be adjusted as required.

Copper removal is more difficult for these highly compacted foils. The flattened filaments are extremely close together and may even be touching. To insure complete copper removal, a continuous liquid magnesium dipping process can be used to leaching the copper from the foil. Copper is completely soluble in liquid magnesium while Ta and Nb are insoluble. A similar process, used to leach the copper matrix with liquid Sn was shown in our aforesaid U.S. patent application Ser. No. 09/532,362. The magnesium matrix can then be easily removed by a combination of vacuum distillation and an acid clean step.

To increase the total capacitance of this foil shape, several foils can be arranged much like that of the MLCC (Multi-Layer Ceramic Capacitor) where layer are stacked together and electrically connected in parallel. This concept is also shown in paper by J. Gerblinger, given at the Symposium on Tantalum and Niobium, San Francisco held Oct. 22, 2002 titled *Tantalum Capacitors Today and Tomorrow*, pages 329–342. See, in particular, FIGS. 3 and, in which Multi-Anode capacitors designs are shown and are cited as a solution for obtaining minimum ESR performance.

The invention claimed is:

1. A process for making superconducting material useful for forming electrolytic devices comprising the steps of:
   a) establishing multiple niobium or tantalum components in a primary billet of a ductile material;
   b) working the primary billet to a series of reduction steps to form said niobium or tantalum components into rounded elongated elements;
   c) cutting the rounded elongated elements from step b) and forming the cut elements into a stack around a metal core;
   d) surrounding the stack of cut and stacked elements from step c) with a porous confining layer to form a secondary billet;
   e) working the secondary billet from step d) through a series of reduction steps including twisting and rolling, to flatten the stacked elements into thin ribbon so that each of the flatten elements having an Aspect Ratio of greater than 5:1;

f) cutting the worked billet from step e) into sections; and g) leaching the core and sheath at least in part.

2. The process of claim 1, wherein said leaching is in an acid leach.

3. The process of claim 1, wherein said leaching step is in a liquid metal bath.

4. The process of claim 3, wherein said liquid metal bath comprises molten magnesium.

5. The process of claim 1, wherein said porous confining layer contains a gap that renders the confining layer circumferentially discontinuous, but overlapping.

6. The process of claim 1, wherein said porous confining layer contains a gap that renders the confining layer circumferentially discontinuous.

7. The process of claim 1, wherein several separate segments are used to construct a multi anode capacitor assembly.

8. The process of claim 1, wherein said metal core consists of a single metal rod.

9. The process of claim 8, wherein said single metal rod has a cross-sectional area not exceeding 20% of said secondary billet before working.

10. The process of claim 1, wherein the Aspect Ratio is 40:1.

* * * * *

UNITED STATES PATENT AND TRADEMARK OFFICE
CERTIFICATE OF CORRECTION

| | | |
|---|---|---|
| PATENT NO. | : 7,146,709 B2 | Page 1 of 1 |
| APPLICATION NO. | : 10/736650 | |
| DATED | : December 12, 2006 | |
| INVENTOR(S) | : Wong | |

It is certified that error appears in the above-identified patent and that said Letters Patent is hereby corrected as shown below:

Page 2, under References Cited, add the following:

US-3,743,989      07-1973      Nicolas et al.      336/5

Signed and Sealed this

Eighth Day of May, 2007

JON W. DUDAS
*Director of the United States Patent and Trademark Office*